(12) United States Patent
Park et al.

(10) Patent No.: US 8,911,883 B2
(45) Date of Patent: *Dec. 16, 2014

(54) PHOTOSENSITIVE SEMICONDUCTOR NANOCRYSTALS, PHOTOSENSITIVE COMPOSITION COMPRISING SEMICONDUCTOR NANOCRYSTALS AND METHOD FOR FORMING SEMICONDUCTOR NANOCRYSTAL PATTERN USING THE SAME

(75) Inventors: Jong Jin Park, Gyeonggi-Do (KR); Eun Joo Jang, Gyeonggi-Do (KR); Shin Ae Jun, Gyeonggi-Do (KR); Tae Kyung Ahn, Seoul-Si (KR); Sung Hun Lee, Gyeonggi-Do (KR)

(73) Assignee: Samsung Electronics Co., Ltd. (KR)

( * ) Notice: Subject to any disclaimer, the term of this patent is extended or adjusted under 35 U.S.C. 154(b) by 0 days.
This patent is subject to a terminal disclaimer.

(21) Appl. No.: 12/219,231

(22) Filed: Jul. 17, 2008

(65) Prior Publication Data
US 2008/0290797 A1 Nov. 27, 2008

Related U.S. Application Data

(62) Division of application No. 11/378,482, filed on Mar. 20, 2006, now Pat. No. 7,476,487, which is a division of application No. 10/814,264, filed on Apr. 1, 2004, now Pat. No. 7,199,393.

(30) Foreign Application Priority Data

Oct. 21, 2003 (KR) ................. 2003-73338

(51) Int. Cl.
| | | |
|---|---|---|
| H01J 1/63 | (2006.01) | |
| H01L 29/04 | (2006.01) | |
| C30B 29/60 | (2006.01) | |
| H01L 51/42 | (2006.01) | |
| C08F 2/28 | (2006.01) | |
| C30B 33/00 | (2006.01) | |
| G03F 7/004 | (2006.01) | |
| B82Y 20/00 | (2011.01) | |
| B82Y 30/00 | (2011.01) | |
| G03F 7/027 | (2006.01) | |

(52) U.S. Cl.
CPC . *C08F 2/28* (2013.01); *C30B 29/60* (2013.01); *H01L 51/426* (2013.01); *G03F 7/027* (2013.01); *Y10S 977/773* (2013.01); *C30B 33/00* (2013.01); *G03F 7/0047* (2013.01); *Y02E 10/549* (2013.01); *B82Y 20/00* (2013.01); *B82Y 30/00* (2013.01); *G03F 7/0043* (2013.01); *Y10S 428/917* (2013.01)
USPC ........ 428/690; 428/917; 428/411.1; 428/336; 257/40; 257/49; 977/773

(58) Field of Classification Search
USPC ....................................................... 428/690
See application file for complete search history.

(56) References Cited

U.S. PATENT DOCUMENTS

| | | | |
|---|---|---|---|
| 5,178,959 A | 1/1993 | Eckberg et al. | |
| 5,537,000 A | 7/1996 | Alivisatos et al. | |

(Continued)

FOREIGN PATENT DOCUMENTS

| | | |
|---|---|---|
| EP | 0622439 | 11/1994 |
| JP | 06-349579 | 12/1994 |

(Continued)

OTHER PUBLICATIONS

Chinese Office Action for application No. 200410102383X issued Mar. 20, 2009 with English Translation.

(Continued)

*Primary Examiner* — J. L. Yang
(74) *Attorney, Agent, or Firm* — Cantor Colburn LLP

(57) ABSTRACT

An organic-inorganic hybrid electroluminescent device having a semiconductor nanocrystal pattern prepared by producing a semiconductor nanocrystal film using semiconductor nanocrystals, where the nanocrystal is surface-coordinated with a compound containing a photosensitive functional group, exposing the film through a mask and developing the exposed film.

9 Claims, 4 Drawing Sheets
(3 of 4 Drawing Sheet(s) Filed in Color)

(56) References Cited

U.S. PATENT DOCUMENTS

| | | | |
|---|---|---|---|
| 5,559,057 | A | 9/1996 | Goldstein |
| 5,751,018 | A | 5/1998 | Alivisatos et al. |
| 6,139,626 | A | 10/2000 | Norris et al. |
| 6,207,229 | B1 | 3/2001 | Bawendi et al. |
| 6,259,506 | B1 | 7/2001 | Lawandy |
| 6,269,506 | B1 | 8/2001 | Hollatz et al. |
| 6,306,559 | B1 * | 10/2001 | Tanamura et al. ............ 430/315 |
| 6,602,671 | B1 | 8/2003 | Bawendi et al. |
| 6,797,412 | B1 * | 9/2004 | Jain et al. ...................... 428/690 |
| 7,199,393 | B2 * | 4/2007 | Park et al. ...................... 257/40 |
| 2001/0040232 | A1 * | 11/2001 | Bawendi et al. ....... 252/301.4 R |
| 2002/0045045 | A1 | 4/2002 | Adams et al. |
| 2002/0076642 | A1 | 6/2002 | Zampini et al. |
| 2002/0110180 | A1 | 8/2002 | Barney et al. |
| 2003/0058916 | A1 * | 3/2003 | Tanaka et al. ................. 372/101 |
| 2003/0073042 | A1 | 4/2003 | Cernigliaro et al. |
| 2003/0180665 | A1 | 9/2003 | Wang |
| 2004/0007169 | A1 * | 1/2004 | Ohtsu et al. ...................... 117/84 |
| 2004/0023010 | A1 * | 2/2004 | Bulovic et al. ................ 428/209 |
| 2004/0222412 | A1 | 11/2004 | Bai et al. |
| 2004/0253536 | A1 | 12/2004 | Park et al. |
| 2005/0008880 | A1 | 1/2005 | Kunze et al. |
| 2005/0054004 | A1 | 3/2005 | Alivisatos et al. |
| 2013/0011635 | A1 * | 1/2013 | Park et al. .................. 428/195.1 |

FOREIGN PATENT DOCUMENTS

| | | |
|---|---|---|
| JP | 10186426 | 7/1998 |
| JP | 11-027621 A | 8/2000 |
| JP | 11-044245 A | 9/2000 |
| JP | 2001-203382 | 7/2001 |
| JP | 2002-246642 | 8/2002 |
| JP | 2002-525394 | 8/2002 |
| JP | 2003288813 | 10/2003 |
| WO | 03050329 | 6/2003 |
| WO | 03078699 | 9/2003 |

OTHER PUBLICATIONS

M. Colocci et al., "Growth Patterns of Self-Assembled InAs Quantum Dots Near the Two-Dimensional to Three-Dimensional Transition," Appl. Phys. Lett. 70, vol. 23, Jun. 9, 1997, pp. 3140-3142.

Bravo-Vasquez et al."The Photolithographic Deposition of Nanostructured Materials"; Polymeric materials Science and Engineering; vol. 81; 1999; pp. 16-17.

European Search Report for application No. 04256185.2 dated Aug. 7, 2009.

European Patent Office Action dated Dec. 20, 2013 of the corresponding European Patent Application No. 04256185.2, 7 pages.

Wiche, et al., "Functional Micro Devices Using 'Nanoparticle-Photoresist' Composites," International Journal of Computational Engineering Science, vol. 4, No. 3 (2003), pp. 525-528.

* cited by examiner

Fig. 1

 ─(X-A-B)$_m$

X : -COO, -S, -NH$_2$, -CN, etc.

A : -(CR$_2$)$_n$-, -(CR$_2$)$_n$-COO-, -(CR$_2$)$_n$-NHCO-, -(CR$_2$)$_n$-OCO-, -(CR$_2$)$_n$-O-,

─⌬─ , ─⌬─⌬─ , etc. [in which R is H, C$_{1-3}$ alkyl group, and n is 0, or an integer of 1 or more]

B : -CR$_1$=CR$_2$R$_3$ [in which R$_1$ is H, -COOH, C$_{1-3}$ alkyl group, halogen group, halogenated alkyl group, and R$_2$ and R$_3$ is independently H, C$_{1-30}$ alkyl group, -CN, -COOH, halogen group, unsaturated aliphatic hydrocarbon group having at least one carbon-carbon double bond, ─⌬─ , ─⌬─ (wherein R'
                                                    |
                                                    R' is halogen group, nitro group, hydroxy group, etc.), etc.]

Fig. 2

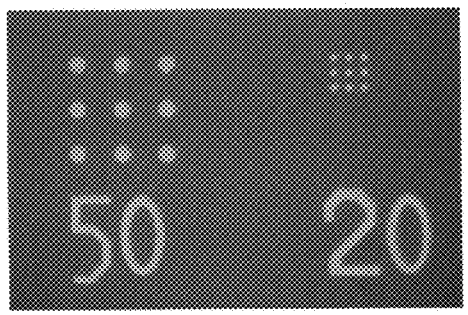

PHOTOSENSITIVE SEMICONDUCTOR NANOCRYSTALS, PHOTOSENSITIVE COMPOSITION COMPRISING SEMICONDUCTOR NANOCRYSTALS AND METHOD FOR FORMING SEMICONDUCTOR NANOCRYSTAL PATTERN USING THE SAME

CROSS-REFERENCE TO RELATED APPLICATIONS

This application is a Division of U.S. patent application Ser. No. 11/378,482, filed on 20 Mar. 2006, which is a Division of U.S. patent application Ser. No. 10/814,264, filed on 1 Apr. 2004, now U.S. Pat. No. 7,199,393, which claims priority under 35 U.S.C. §119(a) to Korean Patent Application No. 2003-73338 filed on Oct. 21, 2003, which are all herein incorporated by reference.

BACKGROUND OF THE INVENTION

1. Field of the Invention

The present invention relates to photosensitive semiconductor nanocrystals, a photosensitive composition comprising semiconductor nanocrystals and a method for forming a semiconductor nanocrystal pattern using the same. More particularly, the present invention relates to semiconductor nanocrystals that are surface-coordinated with a compound containing a photosensitive functional group, a photosensitive composition comprising semiconductor nanocrystals, and a method for forming a semiconductor nanocrystal pattern by forming a film using the photosensitive semiconductor nanocrystals or the photosensitive composition, exposing the film to light and developing the exposed film.

2. Description of the Related Art

Due to the quantum confinement effects of compound semiconductor nanocrystals (i.e. quantum dots), the characteristic energy bandgap of semiconductor materials are changed. Since the control over the materials, structure, shape and size of the nanocrystals enables the control of the corresponding bandgaps, various energy levels can be obtained.

In recent years, there have been many trials to prepare semiconductor nanocrystals by a wet chemistry method wherein a precursor material is added to an organic solvent and nanocrystals are grown so as to have an intended size. According to the wet chemistry method, as the nanocrystals are grown, the organic solvent is naturally coordinated to the surface of the nanocrystals and acts as a dispersant. Accordingly, the organic solvent allows the nanocrystals to grow in the nanometer-scale level. Using vapor deposition processes, e.g., MOCVD (metal organic chemical deposition) and MBE (molecular beam epitaxy), it is difficult to uniformly control the size, shape and density of nanocrystals. In contrast, the wet chemistry method has an advantage in that nanocrystals can be uniformly synthesized in various sizes by appropriately controlling the concentration of precursors used, the kind of organic solvents, synthesizing temperature and time, etc.

However, since nanocrystals prepared by the wet chemistry method are commonly dispersed in an organic solvent, such as toluene or chloroform, techniques of forming a thin film as well as pattern forming method of nanocrystals are required in order to apply the nanocrystals to electronic devices. Patterning techniques reported hitherto are mainly associated with the patterning of nanocrystals by vapor deposition. These techniques, however, have a shortcoming in that control over the uniformity of size, shape, and density is difficult (Appl. Phys. Letter, 1997, 70, 3140).

In this regard, U.S. Pat. No. 5,559,057 suggests a method for forming a pattern of nanocrystals which comprises the steps of vapor-depositing or spraying nanocrystals using a mask to deposit nanocrystals only on the areas not covered with a mask, irradiating the nanocrystals with an electron beam to produce a thin film, and removing the mask. U.S. Pat. No. 6,139,626 discloses a method for indirectly forming a pattern of nanocrystals by filling in pores of a template with nanocrystals wherein the template may be patterned in any configuration. However, these patterning methods involve the use of a high-energy electron beam and a troublesome lift-off operation of the mask used. In addition, the template material may affect the performances of the pattern to be formed, and there is thus a limitation in the kind of materials that can be patterned.

Further, U.S. Pat. No. 5,751,018 discloses a method for aligning nanocrystals using terminal groups of a self-assembled monolayer formed on a metal substrate. U.S. Pat. No. 6,602,671 describes a method for binding dispersed nanocrystals to a polymeric support. Since the above-mentioned methods are not substantially associated with patterning, they have limited applicability to the patterning of nanocrystals.

Thus, there exists a need in the art for a method for forming a pattern of semiconductor nanocrystals in a simple manner, without the use of a template or a deposition process requiring high vacuum and high temperature conditions.

SUMMARY OF THE INVENTION

A feature of the present invention is to provide novel photosensitive semiconductor nanocrystals for forming a semiconductor nanocrystal pattern.

Another feature of the present invention is to provide a novel photosensitive composition comprising semiconductor nanocrystals for forming a semiconductor nanocrystal pattern.

Still another feature of the present invention is to provide a method for forming a semiconductor nanocrystal pattern using the above photosensitive semiconductor nanocrystals and the photosensitive composition.

In accordance with a feature of the present invention, there is provided semiconductor nanocrystals surface-coordinated with a compound containing a photosensitive functional group.

In accordance with another feature of the present invention, there is provided a photosensitive composition for a semiconductor nanocrystal pattern, comprising i) semiconductor nanocrystals, and ii) a photocurable compound.

In accordance with still another feature of the present invention, there is provided a method for forming a semiconductor nanocrystal pattern, comprising the steps of: i) producing a semiconductor nanocrystal film using the above semiconductor nanocrystals or the above photosensitive composition; ii) exposing the film through a mask; and iii) developing the exposed film.

In accordance with still another feature of the present invention, there is provided an organic-inorganic hybrid electroluminescent device, wherein the semiconductor nanocrystal pattern prepared according to the above method is contained as a luminescent layer.

BRIEF DESCRIPTION OF THE DRAWINGS

The patent or patent application file contains at least one drawing executed in color. Copies of this patent or patent application publication with color drawing)s) will be provided by the Office upon request and payment of the necessary fee.

The above and other objects, features and other advantages of the present invention will be more clearly understood from the following detailed description taken in conjunction with the accompanying drawings, in which:

FIG. 1 is a schematic diagram of a semiconductor nanocrystal surface-coordinated with a compound containing a photosensitive functional group;

FIG. 2 is a photograph of a semiconductor nanocrystal pattern prepared in Example 1 of the present invention (enlarged by 1000 times, taken with UV microscope);

DETAILED DESCRIPTION OF THE PRESENT INVENTION

Figure 3:
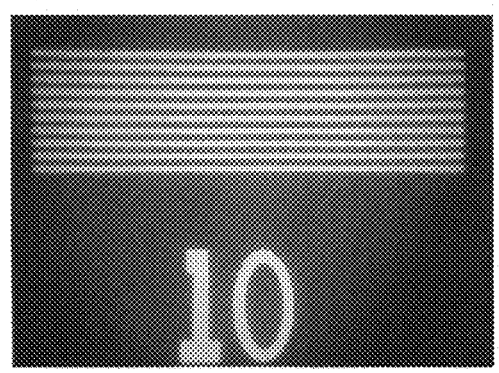
FIG. 3 is a photograph of a semiconductor nanocrystal pattern prepared in Example 3 of the present invention (enlarged by 1000 times, taken with UV microscope)

Hereinafter, the present invention will be explained in more detail with reference to the accompanying drawings.
Photosensitive Semiconductor Nanocrystals The photosensitive semiconductor nanocrystals of the present invention are semiconductor nanocrystals surface-coordinated with a compound containing a photosensitive functional group.

Semiconductor nanocrystals usable in the present invention may include all semiconductor nanocrystals prepared from metal precursors by a wet chemistry method. For example, the semiconductor nanocrystals may be prepared by adding a corresponding metal precursor to an organic solvent in the absence or presence of a dispersant, and growing crystals at a predetermined temperature. Examples of suitable semiconductor nanocrystals usable in the present invention include Group II-IV, III-IV and V compound nanocrystals and mixtures thereof. More preferred examples of nanocrystals include, but are not limited to, CdS, CdSe, CdTe, ZnS, ZnSe, ZnTe, HgS, HgSe, HgTe, GaN, GaP, GaAs, InP, InAs and mixtures thereof. If the semiconductor nanocrystals are composed of two or more compounds, it may be a uniformly mixed type, gradiently mixed type, core-shell type or ally type.

The photosensitive compound coordinated to the surface of the semiconductor nanocrystals is a compound wherein a photoreactive functional group (e.g., carbon-carbon double bond or acryl group) is selectively bonded to a linker (e.g., cyanide, thiol (SH), amino, carboxylic acid group or phosphonic acid group). Selectively, there may be an alkylene, amide, phenylene, biphenylene, ester or ether group between the photoreactive functional group and the linker. Preferably, the photosensitive compound is represented by Formula 1 below:

wherein X is NC—, HOOC—, HRN—, POOOH—, RS— or RSS— (in which R is a hydrogen atom or a $C_{1\sim10}$ saturated or unsaturated aliphatic hydrocarbon group); A is a direct bond, an aliphatic organic group, a phenylene group or a biphenylene group; and B is an organic group containing at least one carbon-carbon double bond, which may be substituted with at least one group selected from the group consisting of —CN, —COOH, halogen groups, $C_{1\sim5}$ halogenated alkyl groups, amine groups, $C_{6\sim15}$ aromatic hydrocarbon groups, and $C_{6\sim12}$ aromatic hydrocarbon groups substituted with F, Cl, Br, a halogenated alkyl group, R'O— (in which R' is a hydrogen atom or a $C_{1\sim5}$ alkyl group), —COOH, an amine group or —NO$_2$.

More preferably, the aliphatic organic group in the substituent A of Formula 1 is a saturated aliphatic hydrocarbon group such as —(CR$_2$)$_n$— (in which R is a hydrogen atom, a $C_{1\sim5}$ alkyl group, and n is an integer of 1~30), an aliphatic ester group containing an ester moiety (—COO—), an aliphatic amide group containing an amide moiety (—NHCO—), an aliphatic oxycarbonyl group containing an oxycarbonyl moiety (—OCO—), or an aliphatic ether group containing an ether moiety (—O—). The aliphatic organic group may be branched with a $C_{1\sim5}$ alkyl group, or may be substituted with by a hydroxyl, amine or thiol group.

More preferably, the moiety B in Formula 1 is an organic group represented by Formula 2 below:

wherein R$_1$ is a hydrogen atom, —COOH, a halogen group, a $C_{1\sim5}$ alkyl group or a halogenated alkyl group; and R$_2$ and R$_3$ are each independently a hydrogen atom, a $C_{1\sim30}$ alkyl group, —CN, —COOH, a halogen group, a $C_{1\sim5}$ halogenated alkyl group, a $C_{2\sim30}$ unsaturated aliphatic hydrocarbon group containing at least one carbon-carbon double bond, a $C_{6\sim12}$ aromatic hydrocarbon group substituted or unsubstituted with F, Cl, Br, hydroxyl, a C1~5 halogenated alkyl group, an amine group, R'O— (in which R' is a $C_{1\sim5}$ alkyl group), —COOH or —NO$_2$.

In the moieties R$_2$ and R$_3$ of Formula 2, the $C_{1\sim30}$ alkyl group and the $C_{2\sim30}$ unsaturated aliphatic hydrocarbon group containing at least one carbon-carbon double bond may be branched by an alkyl group, and if necessary, may be substituted with a hydroxyl group, a carboxyl group, etc. The number of the double bonds in the unsaturated aliphatic hydrocarbon group is not especially limited, but is preferably 3 or less.

Preferred examples of the compound represented by Formula 1 include, but are not limited to, methacrylic acid, crotonic acid, vinylacetic acid, tiglic acid, 3,3-dimethylacrylic acid, trans-2-pentenoic acid, 4-pentenoic acid, trans-2-methyl-2-pentenoic acid, 2,2-dimethyl-4-pentenoic acid, trans-2-hexenoic acid, trans-3-hexenoic acid, 2-ethyl-2-hexenoic acid, 6-heptenoic acid, 2-octenoic acid, citronellic acid, undecylenic acid, myristoleic acid, palmitoleic acid, oleic acid, elaidic acid, cis-11-elcosenoic acid, euric acid, nervonic acid, trans-2,4-pentadienoic acid, 2,4-hexadienoic acid, 2,6-heptadienoic acid, geranic acid, linoleic acid, 11,14-eicosadienoic acid, cis-8,11,14-eicosatrienoic acid, arachidonic acid, cis-5,8,11,14,17-eicosapentaenoic acid, cis-4,7,10,13,16,19-docosahexaenoic acid, fumaric acid, maleic acid, itaconic acid, ciraconic acid, mesaconic acid, trans-glutaconic acid, trans-beta-hydromuconic acid, trans-traumatic acid, trans-muconic acid, cis-aconitic acid, trans-aconitic acid, cis-3-chloroacrylic acid, trans-3-chloroacrylic acid, 2-bromoacrylic acid, 2-(trifluoromethyl)acrylic acid, trans-styrylacetic acid, trans-cinnamic acid, α-methylcinnamic acid, 2-methylcinnamic acid, 2-fluorocinnamic acid, 2-(trifluoromethyl)cinnamic acid, 2-chlorocinnamic acid, 2-methoxycinnamic acid, 2-hydroxycinnamic acid, 2-nitrocinnamic acid, 2-carboxycinnamic acid, trans-3-fluorocinnamic acid, 3-(trifluoromethyl)cinnamic acid, 3-chlorocinnamic acid, 3-bromocinnamic acid, 3-methoxycinnamic acid, 3-hydroxycinnamic acid, 3-nitrocinnamic acid, 4-methylcinnamic acid, 4-fluorocinnamic acid, trans-4-(trifluoromethyl)-cinnamic acid, 4-chlorocinnamic acid, 4-bromocinnamic acid, 4-methoxycinnamic acid, 4-hydroxycinnamic acid, 4-nitrocinnamic acid, 3,3-dimethoxycinnamic acid, 4-vinylbenzoic acid, allyl methyl sulfide, allyl disulfide, diallyl amine, oleylamine, 3-amino-1-propanol vinyl ether, 4-chlorocinnamonitrile, 4-methoxycinnamonitrile, 3,4-dimethoxycinnamonitrile, 4-dimethylaminocinnamonitrile, acrylonitrile, allyl cyanide, crotononitrile, methacrylonitrile, cis-2-pentenenitrile, trans-3-pentenenitrile, 3,7-dimethyl-2,6-octadienenitrile and 1,4-dicyano-2-butene.

The photosensitive semiconductor nanocrystals of the present invention can be prepared by obtaining nanocrystals from a corresponding metal precursor, dispersing the obtained nanocrystals in an organic solvent, and treating the dispersion with the photosensitive compound of Formula 1. The treatment with the photosensitive compound is not especially limited, but is preferably carried out by refluxing the dispersion of the nanocrystals in the presence of the photosensitive compound. The reflux conditions, including time and temperature, and the concentration of the photosensitive compound can be properly controlled according to the kind of the dispersing solvent, the nanocrystals and the photosensitive compound coordinated to the surface of the nanocrystals. Alternatively, nanocrystals are surface-coordinated with a dispersant having a reactive end group, such as mercaptopropanol, and then reacted with a photosensitive compound capable of reacting with the reactive end group of the dispersant, such as methacryloyl chloride, thereby producing nanocrystals surface-coordinated with the photosensitive compound.

Still alternatively, semiconductor nanocrystals may be directly surface-coordinated with a photosensitive compound by adding a metal precursor into an organic solvent and growing crystals at the predetermined temperature in the presence of the photosensitive compound. The kind of organic solvent, the crystal-growth temperature and the concentration of the precursor can be appropriately varied according to the kind of the photosensitive compound, and the kind, size and shape of the desired semiconductor nanocrystals.

A preferred embodiment of the photosensitive semiconductor nanocrystals according to the present invention is schematically shown in FIG. 1. As shown in FIG. 1, X is a linker binding the semiconductor nanocrystals to a photosensitive functional group such as aryl or vinyl group. The surface-coordinating rate of the photosensitive compound to the semiconductor nanocrystals can be appropriately controlled by changing the mixing ratio of the nanocrystals and the compound.

Photosensitive Composition for Pattern Formation of Semiconductor Nanocrystals

The photosensitive composition of the present invention comprises i) semiconductor nanocrystals, and ii) a photocurable compound As to the semiconductor nanocrystals, common semiconductor nanocrystals or photosensitive semiconductor nanocrystals according to the present invention may be used. Where photosensitive semiconductor nanocrystals of the present invention are used, it is advantageous that substitution with a compound containing a photosensitive functional group is unnecessary. The semiconductor nanocrystals contained in the photosensitive composition of the present invention are as described above.

As to the photocurable compound contained in the photosensitive composition, polymers containing at least one acryl and/or vinyl group and ether-based compounds can be used. More concretely, polymers containing at least one acryl and/or vinyl group include multifunctional acrylate-based compounds, multifunctional polyalkyleneoxide compounds and polysiloxanes containing at least one acryl and/or vinyl group.

Preferred examples of the photocurable compound include, but are not limited to, allyloxylated cyclohexyl diacrylate, bis(acryloxy ethyl)hydroxyl isocyanurate, bis(acryloxy neopentylglycol) adipate, bisphenol A diacrylate, bisphenyl A dimethacrylate, 1,4-butanediol diacrylate, 1,4-butanediol dimethacrylate, 1,3-butyleneglycol diacrylate, 1,3-butyleneglycol dimethacrylate, dicyclopentanyl diacrylate, diethyleneglycol diacrylate, diethyleneglycol dimethacrylate, dipentaerythirol hexaacrylate, dipentaerythirol monohydroxy pentacrylate, ditrimethylolpropane tetraacrylate, ethyleneglycol dimethacrylate, glycerol methacrylate, 1,6-hexanediol diacrylate, neopentylglycol dimethacrylate, neopentylglycol hydroxypivalate diacrylate, pentaerythritol triacrylate, pentaerythritol tetraacrylate, phosphoric acid dimethacrylate, polyetyleneglycol diacrylate, polypropyleneglycol diacrylate, tetraethyleneglycol diacrylate, tetrabromobisphenol A diacrylate, triethyleneglycol divinylether, triglycerol diacrylate, trimethylolpropane triacrylate, tripropyleneglycol diacrylate, tris(acryloxyethyl)isocyanurate, phosphoric acid triacrylate, phosphoric acid diacrylate, acrylic acid propargyl ester, vinyl terminated polydimethylsiloxane, vinyl terminated diphenylsiloxane-dimethylsiloxane copolymer, vinyl terminated polyphenylmethylsiloxane, vinyl terminated trifluoromethylsiloxane-dimethylsiloxane copolymer, vinyl terminated diethylsiloxane-dimethylsiloxane copolymer, vinylmethylsiloxane, monomethacryloyloxypropyl terminated polydimethyl siloxane, monovinyl terminated polydimethyl siloxane and monoallyl-mono trimethylsiloxy terminated polyethylene oxide.

The composition ratio of i) the semiconductor nanocrystals and ii) the photocurable compound contained in the photosensitive composition of the present invention is not especially limited, and can be properly controlled depending on the photocurability (i.e. curing rate, state of a cured film, etc.), binding ability between the photosensitive compound and the nanocrystals, etc.

Pattern Formation of Semiconductor Nanocrystals

A semiconductor nanocrystal pattern can be formed by a) forming a semiconductor nanocrystal film using the photosensitive semiconductor nanocrystals or the photosensitive composition according to the present invention; b) exposing the film through mask; and c) developing the exposed film.

In step a), the semiconductor nanocrystal film is produced by dispersing the photosensitive semiconductor nanocrystals or the photosensitive composition according to the present invention in a suitable organic solvent, and coating the dispersion onto a substrate. At this step, a photoinitiator may be added to the organic solvent. Unlike common photolithgraphic techniques, the photosensitive semiconductor nanocrystals or the photosensitive composition according to the present invention may be cured without a photoinitiator. However, if necessary, a photoinitiator may be used to assist the crosslinking reaction. Examples of photoinitiators usable in the present invention include those capable of forming free radicals upon light irradiation, such as acetophenone-, benzoin-, benzophenone- and thioxantone-based photoinitiators. Examples of the acetophenone-based initiator usable in the present invention include 4-phenoxy dichloroacetophenone, 4-t-butyl dichloroacetophenone, 4-t-butyl trichloroacetophenone, diethoxyacetophenone, 2-hydroxy-2-methyl-1-phenyl-propane-1-one, 1-(4-isopropylphenyl)-2-hydroxy-2-methyl-propane-1-one, 1-(4-dodecylphenyl)-2-hydroxy-2-methylpropane-1-one, 4-(2-hydroxyethoxy)-phenyl-(2-hydroxy-2-propyl)ketone, 1-hydroxy cyclohexyl phenyl ketone, 2-methyl-1-[4-(methylthio)phenyl]-2-morpholino-propane-1, and the like. Examples of the benzoin-based photoinitiator include benzoin, benzoin methyl ether, benzoin ethyl ether, benzoin isopropyl ether, benzoin isobutyl ether, benzyl dimethyl ketal, etc. Examples of the benzophenone-based photoinitiator include benzophenone, benzoyl benzoic acid, benzoyl benzoic acid methyl ester, 4-phenyl benzophenone, hydroxy benzophenone, 4-benzoyl-4'-methyl diphenyl sulphide, 3,3'-dimethyl-4-methoxy benzophenone and the like.

An organic solvent used in this process is not especially limited, but preferably those capable of homogeneously dispersing nanocrystals and being easily removed after application are used. More preferably, DMF, 4-hydroxy-4-methyl-2-pentanone, ethylene glycol monoethyl ether, 2-methoxyethanol, chloroform, chlorobenzene, toluene, teterahydrofuran, dichloromethane, hexane, heptane, octane, nonane, decane or a mixture thereof is used. The application may be carried out by a spin coating, dip coating, spray coating or blade coating process, but is not especially limited thereto. The film thus obtained is dried at 30-300° C. and preferably 40-120° C. to evaporate the organic solvents ahead of light exposure.

In step b), the film is selectively exposed to an electromagnetic wave through a photomask having a desired pattern. At this time, a crosslinking reaction takes place through photosensitive functional groups or photocurable compounds in the exposed area. This crosslinking reaction enables the formation of a network structure of semiconductor nanocrystals, resulting in a solubility difference between the exposed and unexposed areas. Based on the solubility difference, development of the film with a developing agent enables the formation of a negative pattern of semiconductor nanocrystals. The light exposure may be carried out by a contact or non-contact exposure process. In addition, the exposure dose is not especially limited, and can be appropriately controlled according to the thickness of the film formed. It is preferred that the light exposure is carried out at an exposure dose of 50-850 mJ/cm$^2$. When the exposure dose is insufficient, a crosslinking reaction is not likely to take place, or a photo bleaching occurs, which causes poor luminescence efficiency of the patterned nanocrystals. A light source usable for the light exposure preferably has an effective wavelength range of 200-500 nm, preferably 300~400 nm, and has an energy range of 100-800 W.

In step c), the exposed film is developed with an appropriate developing agent to form a semiconductor nanocrystal pattern. Examples of developing agents usable in the present invention include organic solvents, such as toluene and chloroform, weakly acidic solutions and weakly basic solutions, and pure water.

Since the semiconductor nanocrystal pattern formed by the method of the present invention exhibits excellent luminescence characteristics, it can be utilized in a variety of fields, including semiconductor devices, e.g., displays, sensors and solar cells. Particularly, the pattern is useful in forming the luminescent layer of an organic-inorganic hybrid electroluminescent device. When the pattern is used to form a luminescent layer, it preferably has a thickness of 5-100 nm. In the organic-inorganic hybrid electroluminescent device, organic layers are formed in an electron transport layer or a hole transport layer except luminescent layer.

The organic electroluminescent device has a structure selected from anode/luminescent layer/cathode, anode/buffer layer/luminescent layer/cathode, anode/hole transport layer/luminescent layer/cathode, anode/buffer layer/hole transport layer/luminescent layer/cathode, anode/buffer layer/hole transport layer/luminescent layer/electron transport layer/cathode, and anode/buffer layer/hole transport layer/luminescent layer/hole blocking layer/cathode, but is not particularly limited to these structures.

As for buffer layer materials, compounds commonly used in the art for this purpose can be used. Preferred examples include, but are not limited to, copper phthalocyanine, polythiophene, polyaniline, polyacetylene, polypyrrole, polyphenylene vinylene and derivatives thereof. As materials for the hole transport layer, compounds commonly used in the art for this purpose can be used but the preferred is polytriphenylamine. As materials for the electron transport layer, compounds commonly used in the art for this purpose can be used but the preferred is polyoxadiazole. As materials for the hole blocking layer, compounds commonly used in the art for this purpose can be used. Preferred examples include, but are not limited to, LiF, BaF$_2$, MgF$_2$ and the like.

The organic-inorganic hybrid electroluminescent device of the present invention does not require particular manufacturing apparatuses and methods and can be manufactured using materials commonly known in the art, in accordance with conventional manufacturing methods.

Hereinafter, the present invention will be described in more detail with reference to the following examples and preparative examples. However, these examples are given for the purpose of illustration and are not to be construed as limiting the scope of the invention.

Preparative Example 1

Preparation of Green Emitting CdSeS Nanocrystals Surface-Coordinated with a Compound Containing a Double Bond 16 g of trioctylamine (hereinafter, referred to as 'TOA'), 0.5 g of oleic acid and 0.4 mmol of cadmium oxide were introduced simultaneously into a 125 ml flask equipped with a reflux condenser. The temperature of the mixture was raised to 300° C. with stirring. Separately, selenium (Se) powder was dissolved in trioctyl phosphine (hereinafter, referred to as 'TOP') to obtain Se-TOP complex solution (Se concentration: about 0.25 M), and sulfur (S) powder was dissolved in TOP to obtain S-TOP complex solution (S concentration: about 1.0 M). 0.9 ml of the S-TOP complex solution and 0.1 ml of the Se-TOP complex solution were rapidly added to the reactant mixture, and then reacted for 4 minutes with stirring. Immediately after the reaction was completed, the reaction mixture was rapidly cooled to room temperature. Ethanol as a non-solvent was added to the reaction mixture, and the resulting mixture was then centrifuged. After the obtained precipitate was separated from the mixture by decanting the supernatant, it was dispersed in toluene in the concentration of 1 wt %. Peak emitting wavelength was about 520 nm in the electroluminescence spectrum of the nanocrystals, and the nanocrystals emitted green light under 365 nm UV lamp.

Preparative Example 2

Preparation of Blue Emitting CdSeS Nanocrystals Surface-Coordinated with a Compound Containing a Double Bond CdSeS nanocrystals were prepared in the same manner as in Preparative Example 1, except that the concentration of Se in the Se-TOP complex solution was set to 0.06 M, and the concentration of S in the S-TOP complex solution was set to 2.0 M. Peak emitting wavelength was about 480 nm in the electroluminescence spectrum of the nanocrystals, and the nanocrystals emitted blue light under 365 nm UV lamp.

Preparative Example 3

Preparation of CdS Nanocrystals Surface-Coordinated with a Compound Containing a Double Bond 2.5 ml of TOA was introduced into a 25 ml flask equipped with a reflux condenser, and then the temperature was raised to 180° C. with stirring. A solution of 50 mg of cadmium dithio diethyl carbamate in 0.9 ml of TOP was rapidly added to the TOA, and then reacted for 10 minutes with stirring. Immediately after the reaction was completed, the reaction mixture was rapidly cooled to room temperature. Ethanol as a non-solvent was added to the reaction mixture, and the resulting mixture was then centrifuged. After the obtained precipitate was separated from the mixture by decanting the supernatant, it was dispersed in toluene in the concentration of 1 wt %. Then, oleic acid was added to the dispersion in the concentration of 5 mM. The resulting mixture was refluxed at 70° C. with stirring. For better surface-binding ability, the nanocrystals were separated from the solvent and dispersed again in toluene followed by adding oleic acid in the concentration of 5 mM and refluxing the mixture for 24 hours at 70° C. with stirring. The above procedure was repeated several times to prepare desired nanocrystals of which the surface was substituted with oleic acid. The final nanocrystals were dispersed in toluene. The peak emitting wavelength in the electroluminescent spectrum of the nanocrystals was 510 nm, and the nanocrystals emitted bluish-green light under 365 nm UV lamp.

Preparative Example 4

Preparation of CdSeS Nanocrystals Surface-Coordinated with a Compound Containing Acryl and Vinyl Groups To the dispersion of the nanocrystals prepared in Preparative Example 1, 3-mercapto-1-propanol was added in the concentration of 32 mM. After the resulting mixture was refluxed at room temperature with stirring for 10 hours, the nanocrystals coordinated with 3-mercapto-1-propanol were separated through centrifuge and then dispersed in toluene in the concentration of 1 wt %. 2 g of the dispersion were introduced into a 250 ml three-neck flask in an ice bath, and 50 g of tetrahydrofuran and 0.1 g of triethylamine (TEA) were added thereto. The reactant mixture was stirred under nitrogen gas for 30 minutes. After 0.15 g of methacryloyl chloride was added dropwise to the mixture using a dropping funnel, the reaction was continued for 4 hours. Then, adducts of salts were filtered off using a 0.1 μm filter. Thereafter, the reaction mixture was washed with 100 ml of distilled water in a separatory funnel to remove unreacted reactants and residual salts. The supernatant was separated from the dispersion in which semiconductor nanocrystals were dispersed, and remaining solvents were removed in a rotary evaporator under nitrogen gas to obtain nanocrystals. The resulting nanocrystals were again dispersed in toluene. The above procedure was repeated several times to obtain a toluene dispersion of final nanocrystals of which the surface was substituted with acryl and vinyl groups.

Preparative Example 5

Preparation of CdS Nanocrystals Surface-Coordinated with a Compound Containing Acryl Group 2.5 ml of TOA was introduced into a 25 ml flask equipped with a reflux condenser, and then the temperature was raised to 180° C. with stirring. A solution of 50 mg of cadmium dithio diethyl carbamate in 0.9 ml of TOP was rapidly added to the TOA, and then reacted for 10 minutes with stirring. Immediately after the reaction was completed, the reaction mixture was rapidly cooled to room temperature. Ethanol as a non-solvent was added to the reaction mixture, and the resulting mixture was then centrifuged. After the obtained precipitate was separated from the mixture by decanting the supernatant, it was dispersed in toluene in the concentration of 1 wt %.

3-Mercapto-1-propanol was added to the dispersion in the concentration of 32 mM. After the resulting mixture was refluxed at room temperature for 10 hours with stirring, it was centrifuged to separate the nanocrystals surface-coordinated with the 3-mercapto-1-propanol. The obtained nanocrystals were again dispersed in toluene in the concentration of 1 wt %. Thereafter, 50 g of tetrahydrofuran and 0.1 g of triethylamine (TEA) were added to 2 g of the dispersion. The mixture was stirred under nitrogen gas for 30 minutes. After 0.15 g of methacryloyl chloride was added dropwise to the mixture using a dropping funnel, the reaction was continued for 4 hours. At this time, adducts of salts were filtered off using a 0.1 μm filter. The reaction mixture was washed with 100 ml of distilled water in a separatory funnel to remove unreacted reactants and residual salts. The supernatant was separated from the dispersion in which semiconductor nanocrystals were dispersed, and remaining solvents were removed in a rotary evaporator under nitrogen gas to prepare nanocrystals. The resulting nanocrystals were again dispersed in toluene. The above procedure was repeated several times to obtain a toluene dispersion of final nanocrystals of which the surface was substituted with acryl group.

Example 1

Formation of a Green Emitting CdSeS Nanocrystal Pattern

The dispersion (1 wt %) of CdSeS nanocrystals prepared in Preparative Example 1 was spin coated onto a glass substrate cleaned with IPA at 2,000 rpm for 30 seconds to provide a semiconductor nanocrystal film. The film was dried at 50° C. for 1 minute, and then at 100° C. for 1 minute to completely evaporate solvents. Then, the film was exposed to 800 W UV light having an effective wavelength of 200-300 nm through a mask having a desired pattern for 300 seconds. The exposed film was developed with toluene to form a semiconductor nanocrystal pattern. FIG. 2 is a photograph showing the emitting state of the pattern under a 365 nm UV lamp. From the photograph, it was confirmed that the nanocrystal pattern was consistent with that of the photomask used, and emitted green light. The peak emitting wavelength was about 520 nm, showing the same result as that of the electroluminescent spectrum of the nanocrystals prepared in Preparative Example 1. In addition, the emitting peak had a full width half maximum (hereinafter, referred to as "FWHM") of approximately 40 nm.

Example 2

Formation of Nanocrystal Pattern Using a Photosensitive Composition 2.5 ml of TOA was introduced into a 25 ml flask equipped with a reflux condenser, and then the temperature was raised to 180° C. with stirring. A solution of 50 mg of cadmium dithio diethyl carbamate in 0.9 ml of TOP was rapidly added to TOA, and then reacted for 10 minutes with stirring. Immediately after the reaction was completed, the reaction mixture was rapidly cooled to room temperature. Ethanol as a nonsolvent was added to the reaction mixture, and the resulting mixture was then centrifuged. After the obtained precipitate was separated from the mixture by decanting the supernatant, it was dispersed in toluene in the concentration of 1 wt %. 2 g of the dispersion and 0.0005 g of dipentaerythritol hexaacrylate (DPHA) were homogeneously mixed to prepare a composition. Then, the composition was spin coated onto a glass substrate cleaned with IPA, at 2,000 rpm for 30 seconds to provide a film. The film was exposed to 800 W UV light having effective wavelength of 200-300 nm through a mask having a desired pattern for 300 seconds. The exposed film was developed with toluene to form a semiconductor nanocrystal pattern. It was observed that the nanocrystal pattern emitted bluish-green light under 365 nm UV lamp. It was confirmed from the observation that the nanocrystal pattern was consistent with that of the photomask used. The peak emitting wavelength was about 510 nm in the electroluminescent spectrum of the pattern.

Example 3

Formation of Green Emitting CdSeS Nanocrystal Pattern Using a Photosensitive Composition 0.2 g of the toluene solution (1 wt %) of CdSeS nanocrystals prepared in Preparative Example 1, and 0.0005 g of dipentaerythritol hexaacrylate (DPHA) were homogeneously mixed to prepare a photosensitive composition. The composition was spin coated onto a glass substrate cleaned with IPA, at 2,000 rpm for 30 seconds to provide a film. Then, the film was exposed to 800 W UV light having an effective wavelength of 200-300 nm through a mask having a desired pattern for 300 seconds. The exposed film was developed with toluene to form a semiconductor nanocrystal pattern. FIG. 3 is a photograph showing the emitting state of the nanocrystal pattern under a 365 nm UV lamp. From the photograph, it was confirmed that the nanocrystal pattern was consistent with that of the photomask used, and emitted green light. The peak emitting wavelength was about 520 nm, showing the same result as that of the electroluminescent spectrum of the nanocrystals prepared in Preparative Example 1. In addition, the emitting peak had FWHM of approximately 40 nm.

Example 4

Figure 4:
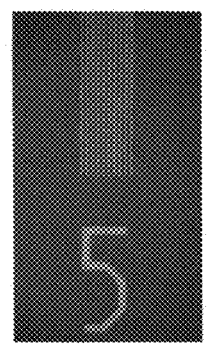
FIG. 4 is a photograph of a semiconductor nanocrystal pattern prepared in Example 4 of the present invention (enlarged by 1000 times, taken with UV microscope)
Figure 5A:
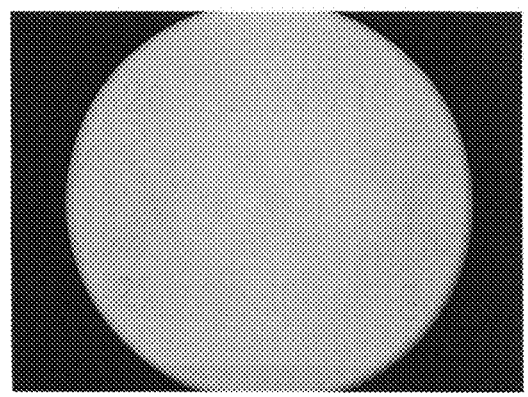
FIGS. 5$a$ and 5$b$ are an optical microscopic image (×1,000) and an AFM image of the semiconductor nanocrystal pattern of FIG. 4.
Figure 5B:
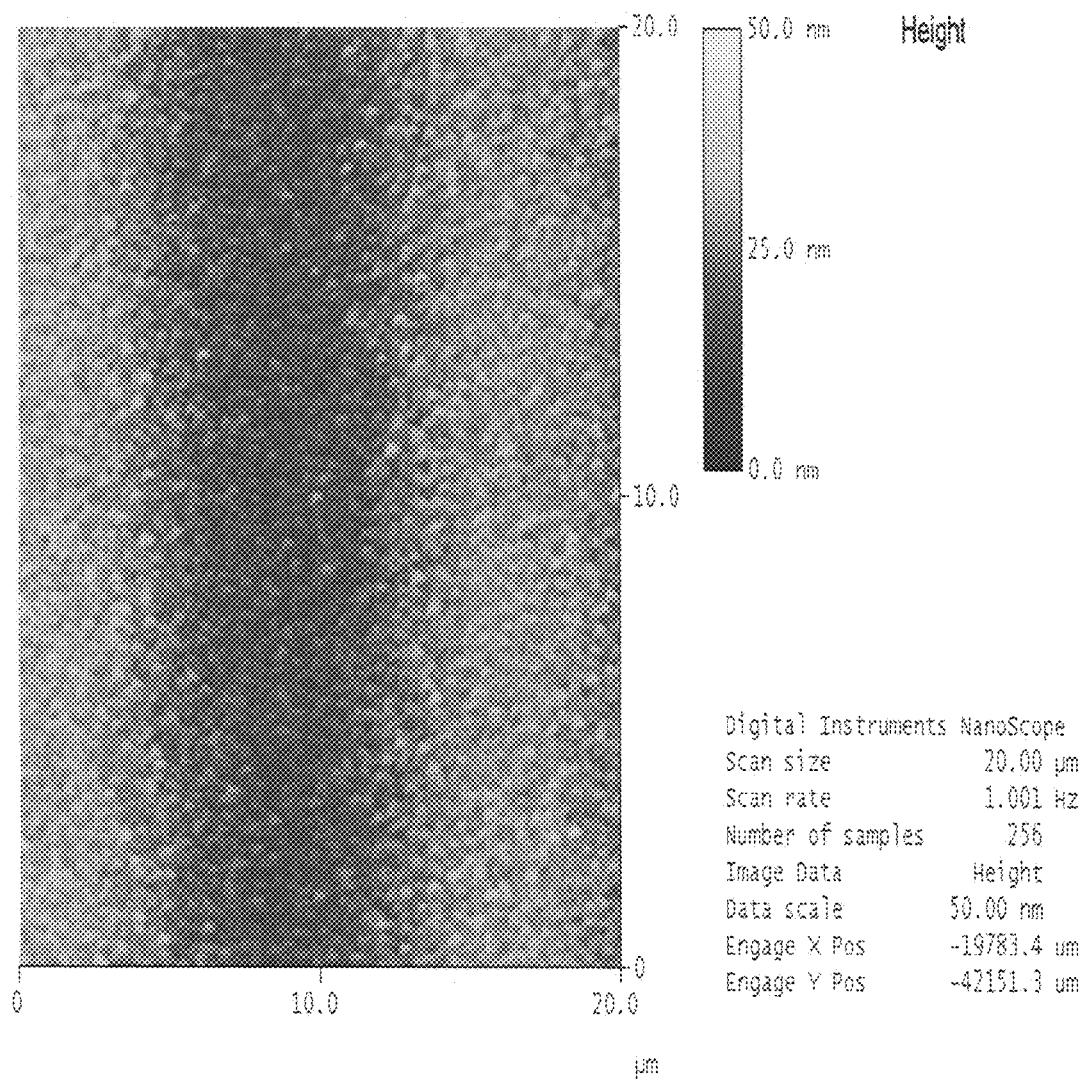

Formation of Blue Emitting CdSeS Nanocrystal Pattern Using a Photosensitive Composition 0.05 g of the toluene solution (1 wt %) of CdSeS nanocrystals prepared in Preparative Example 2, and 0.001 g of DPHA were homogeneously mixed to prepare a composition. The composition was spin coated onto a glass substrate cleaned with IPA, at 2,000 rpm for 30 seconds to provide a film. Then, the film was exposed to 800 W UV light having an effective wavelength of 200-300 nm through a mask having a desired pattern for 300 seconds. The exposed film was developed with toluene to form a semiconductor nanocrystal pattern. FIG. 4 is a photograph showing the emitting state of the nanocrystal pattern under a 365 nm UV lamp. From the photograph, it was confirmed that the nanocrystal pattern was consistent with that of the photomask used, and emitted blue light. The peak emitting wavelength was about 480 nm, and had FWHM of approximately 40 nm. FIGS. 5a and 5b are an optical microscopic image (×1,000) and an AFM image of the semiconductor nanocrystal pattern. From the FIGS. 5a and 5b, it was known that the CdSeS nanocrystals were uniformly dispersed in CdSeS nanocrystal pattern.

Example 5

Patterning of CdS Nanocrystals Surface-Coordinated with a Compound Containing a Carbon-Carbon Double Bond 0.05 g of the toluene solution (1 wt %) of CdS nanocrystals surface-coordinated with oleic acid prepared in Preparative Example 3, was spin coated onto a glass substrate cleaned with IPA, at 2,000 rpm for 30 seconds to provide a semiconductor nanocrystal film. The film was dried at 50° C. for 1 minute, and then at 100° C. for 1 minute to completely evaporate solvents. Then the film was exposed to 800 W UV light having an effective wavelength of 200-300 nm through a mask having a desired pattern for 300 seconds. The exposed film was developed with toluene to form semiconductor nanocrystal pattern. It was confirmed that the nanocrystal pattern was consistent with that of the photomask used, and emitted bluish-green light.

Example 6

Patterning of CdSeS Nanocrystals Surface-Coordinated with a Compound Containing an Acryl Group 0.05 g of the toluene solution (1 wt %) of CdSeS nanocrystals surface-coordinated with a compound containing an acryl group, as prepared in Preparative Example 4, was spin coated onto a glass substrate cleaned with IPA, at 2,000 rpm for 30 seconds to provide semiconductor nanocrystal film. The film was dried at 50° C. for 1 minute and then at 100° C. for 1 minute to completely evaporate solvents. Then, the film was exposed to 800 W UV light having an effective wavelength of 200-300 nm through a mask having a desired pattern for 300 seconds. The exposed film was developed with toluene to form semiconductor nanocrystal pattern. It was confirmed that the nanocrystal pattern was consistent with that of the photomask used, and emitted green light.

Example 7

Patterning of CdS Nanocrystals Surface-Coordinated with a Compound Containing Acryl Group 0.05 g of the toluene solution (1 wt %) of CdS nanocrystals surface-coordinated with a compound containing an acryl group, as prepared in Preparative Example 5, was spin coated onto a glass substrate cleaned with IPA, at 2,000 rpm for 30 seconds to provide a semiconductor nanocrystal film. The film was dried at 50° C. for 1 minute and then at 100° C. for 1 minute to completely evaporate solvents. Then, the film was exposed to 800 W UV light having effective wavelength of 200~300 nm through a mask having a desired pattern for 300 seconds. The exposed film was developed with toluene to form a semiconductor nanocrystal pattern. It was confirmed that the nanocrystal pattern was consistent with that of the photomask used, and emitted green light.

Example 8

Manufacture of Electroluminescent Device Using Nanocrystal Pattern

In this Example, an organic-inorganic hybrid electroluminescent device was manufactured by employing a thin pattern of the nanocrystals prepared in Preparative Example 1 as a luminescent material. PEDOT (poly-3,4-ethylenedioxythiophene) as a hole transport layer was spin-coated onto a patterned ITO substrate to a thickness of 50 nm, and then baked. The toluene solution (1 wt %) of CdSeS nanocrystals prepared in Preparative Example 1 was spin-coated onto the hole transport layer and dried to form a luminescent layer having a thickness of 5 nm. The luminescent layer was exposed to 800 W UV light having an effective wavelength range of 200-300 nm through a mask for 200 seconds and the exposed film was developed with toluene. Alq3 (tris(8-hydroxyquinoline) aluminum) was deposited onto the luminescent layer to form an electron transport layer having a thickness of about 40 nm. LiF and aluminum were sequentially deposited onto the electron transport layer to thickness of 1 nm and 200 nm, respectively, to manufacture an organic-inorganic hybrid electroluminescent device.

Figure 6:
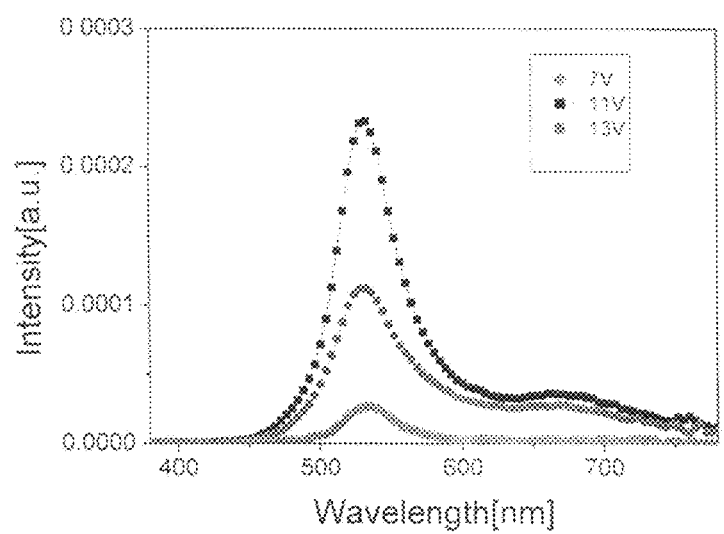
FIG. 6 is an electroluminescent spectrum of an electroluminescent device manufactured in Example 8 of the present invention.

An electroluminescent spectrum of the electroluminescent device is shown in FIG. 6. The spectrum confirms that light was emitted from the nanocrystals by electrons applied to the device. In the electroluminescent spectrum of the device, peak emitting wavelength was 520 nm, and the FWHM was approximately 40 nm. In addition, the intensity of the spectrum was 10 Cd/m2 and the efficiency of the device was about 0.1%.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An organic-inorganic hybrid electroluminescent device comprising:
a semiconductor nanocrystal pattern prepared by
coating a substrate with a dispersion in an organic solvent of semiconductor nanocrystals, wherein the semiconductor nanocrystals are surface-coordinated with a compound containing photosensitive functional groups;
evaporating the organic solvent to form a film of the surface-coordinated semiconductor nanocrystals on the substrate;
exposing the film to light through a mask;
cross-linking the photosensitive functional groups to form a network structure of the semiconductor nanocrystals; and
developing the exposed film,
wherein the compound containing a photosensitive functional group is represented by Formula 1 below:

wherein X is NC—, HOOC—, HRN—, POOOH—, RS— or RSS—, in which R is a hydrogen atom or a $C_{1\sim10}$ saturated or unsaturated aliphatic hydrocarbon group;

A is a direct bond, a saturated aliphatic hydrocarbon group, a phenylene group, a biphenylene group, an aliphatic ester group, an aliphatic amide group, an aliphatic oxycarbonyl group or an aliphatic ether group; and
B is an organic group containing at least one carbon-carbon double bond, which may be substituted with at least one group selected from the group consisting of —CN, —COOH, halogen groups, $C_{1\sim5}$ halogenated alkyl groups, amine groups, $C_{6\sim15}$ aromatic hydrocarbon groups, and $C_{6\sim12}$ aromatic hydrocarbon groups substituted with F, Cl, Br, a halogenated alkyl group, R'O—, in which R' is a hydrogen atom or a $C_{1\sim5}$ alkyl group, —COOH, an amine group, or —NO$_2$.

2. The organic-inorganic hybrid electroluminescent device according to claim 1, wherein the moiety B in Formula 1 is an organic group represented by Formula 2 below:

wherein $R_1$ is a hydrogen atom, —COOH, a halogen group, a $C_{1\sim5}$ alkyl group or a halogenated alkyl group; and $R_2$ and $R_3$ are each independently a hydrogen atom, a $C_{1\sim30}$ alkyl group, —CN, —COOH, a halogen group, a $C_{1\sim5}$ halogenated alkyl group, a $C_{2\sim30}$ unsaturated aliphatic hydrocarbon group containing at least one carbon-carbon double bond, a $C_{6\sim12}$ aromatic hydrocarbon group substituted or unsubstituted with F, Cl, Br, hydroxyl, a $C_{1\sim5}$ halogenated alkyl group, an amine group, R'O—, in which R' is a $C_{1\sim5}$ alkyl group, —COOH, or —NO$_2$.

3. The organic-inorganic hybrid electroluminescent device according to claim 1, wherein the compound containing a photosensitive functional group is selected from a group consisting of acrylic acid compounds, unsaturated fatty acid compounds, cinnamic acid compounds, vinylbenzoic acid compounds, acrylonitrile-based compounds, unsaturated nitrile-based compounds, unsaturated amine compounds, and unsaturated sulfide compounds.

4. The organic-inorganic hybrid electroluminescent device according to claim 1, wherein the compound containing a photosensitive functional group is selected from a group consisting of methacrylic acid, crotonic acid, vinylacetic acid, tiglic acid, 3,3-dimethylacrylic acid, trans-2-pentenoic acid, 4-pentenoic acid, trans-2-methyl-2-pentenoic acid, 2,2-dimethyl-4-pentenoic acid, trans-2-hexenoic acid, trans-3-hexenoic acid, 2-ethyl-2-hexenoic acid, 6-heptenoic acid, 2-octenoic acid, citronellic acid, undecylenic acid, myristoleic acid, palmitoleic acid, oleic acid, elaidic acid, cis-11-elcosenoic acid, euric acid, nervonic acid, trans-2,4-pentadienoic acid, 2,4-hexadienoic acid, 2,6-heptadienoic acid, geranic acid, linoleic acid, 11,14-eicosadienoic acid, cis-8, 11,14-eicosatrienoic acid, arachidonic acid, cis-5,8,11,14, 17-eicosapentaenoic acid, cis-4,7,10,13,16,19-docosahexaenoic acid, fumaric acid, maleic acid, itaconic acid, ciraconic acid, mesaconic acid, trans-glutaconic acid, trans-beta-hydromuconic acid, trans-traumatic acid, trans-muconic acid, cis-aconitic acid, trans-aconitic acid, cis-3-chloroacrylic acid, trans-3-chloroacrylic acid, 2-bromoacrylic acid, 2-(trifluoromethyl)acryl-ic acid, trans-styrylacetic acid, trans-cinnamic acid, alpha.-methylcinnamic acid, 2-methylcinnamic acid, 2-fluorocinnamic acid, 2-(trifluoromethyl) cinnamic acid, 2-chlorocinnamic acid, 2-methoxycinnamic acid, 2-hydroxycinnamic acid, 2-nitrocinnamic acid, 2-carboxycinnamic acid, trans-3-fluorocinnamic acid, 3-(trifluoromethyl)cinnamic acid, 3-chlorocinnamic acid, 3-bromocinnamic acid, 3-methoxycinnamic acid, 3-hydroxycinnamic acid, 3-nitrocinnamic acid, 4-methylcinnamic acid, 4-fluorocinnamic acid, trans-4-(trifluoromethyl)-cinnamic acid, 4-chlorocinnamic acid, 4-bromocinnamic acid, 4-methoxycinnamic acid, 4-hydroxycinnamic acid, 4-nitrocinnamic acid, 3,3-dimethoxycinnamic acid, 4-vinylbenzoic acid, allyl methyl sulfide, allyl disulfide, diallyl amine, oleylamine, 3-amino-1-propanol vinyl ether, 4-chlorocinnamonitrile, 4-methoxycinnamonitrile, 3,4-dimethoxycinnamonitrile, 4-dimethylaminocinnamonitrile, acrylonitrile, allyl cyanide, crotononitrile, methacrylonitrile, cis-2-pentenenitrile, trans-3-pentenenitrile, 3,7-dimethyl-2,6-octadienenitrile, and 1,4-dicyano-2-butene.

5. The organic-inorganic hybrid electroluminescent device according to claim 1, wherein the semiconductor nanocrystal comprises CdS, CdSe, CdTe, ZnS, ZnSe, ZnTe, HgS, HgSe, HgTe, GaN, GaP, GaAs, InP, InAs, or a mixture thereof.

6. The organic-inorganic hybrid electroluminescent device according to claim 5, wherein the semiconductor nanocrystal comprises at least two compounds selected from the group consisting of CdS, CdSe, CdTe, ZnS, ZnSe, ZnTe, HgS, HgSe, HgTe, GaN, GaP, GaAs, InP and InAs, and is a uniformly mixed type, gradiently mixed type, core-shell type, or alloy type.

7. An article, comprising:
a semiconductor nanocrystal pattern prepared by
coating a substrate with a dispersion in an organic solvent of semiconductor nanocrystals, wherein the semiconductor nanocrystals are surface-coordinated with a compound containing photosensitive functional groups;
evaporating the organic solvent to form a film of the surface-coordinated semiconductor nanocrystals on the substrate;
exposing the film to light through a mask;
cross-linking the photosensitive functional groups to form a network structure of the semiconductor nanocrystals; and
developing the exposed film,
wherein the compound containing a photosensitive functional group is represented by Formula 1 below:

$$X\text{-}A\text{-}B \qquad (1),$$

wherein X is NC—, HOOC—, HRN—, POOOH—, RS— or RSS—, in which R is a hydrogen atom or a $C_{1\sim10}$ saturated or unsaturated aliphatic hydrocarbon group;

A is a direct bond, a saturated aliphatic hydrocarbon group, a phenylene group, a biphenylene group, an aliphatic ester group, an aliphatic amide group, an aliphatic oxycarbonyl group or an aliphatic ether group; and B is an organic group containing at least one carbon-carbon double bond, which may be substituted with at least one group selected from the group consisting of —CN, —COOH, halogen groups, $C_{1\sim5}$ halogenated alkyl groups, amine groups, $C_{6\sim15}$ aromatic hydrocarbon groups, and $C_{6\sim12}$ aromatic hydrocarbon groups substituted with F, Cl, Br, a halogenated alkyl group, R'O—, in which R' is a hydrogen atom or a $C_{1\sim5}$ alkyl group, —COOH, an amine group, or —NO$_2$.

8. The organic-inorganic hybrid electroluminescent device of claim 1, wherein the exposing further comprises exposing the film at an exposure dose of 50 millijoules per square centimeter to 850 millijoules per square centimeter.

9. The organic-inorganic hybrid electroluminescent device of claim 1, wherein the exposing further comprises exposing the film to light having a wavelength of 200 nanometers to 500 nanometers and an energy of 100 watts to 800 watts.

* * * * *